United States Patent
Chiu et al.

(10) Patent No.: US 8,466,750 B2
(45) Date of Patent: Jun. 18, 2013

(54) VCO UTILIZING AN AUXILIARY VARACTOR WITH TEMPERATURE DEPENDENT BIAS

(75) Inventors: Janice Chiu, Tustin, CA (US); Hooman Darabi, Laguna Niguel, CA (US); Tom (Qiang) Li, Irvine, CA (US); Shrlung Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 57 days.

(21) Appl. No.: 13/170,040

(22) Filed: Jun. 27, 2011

(65) Prior Publication Data

US 2012/0326797 A1 Dec. 27, 2012

(51) Int. Cl.
*H03L 7/099* (2006.01)
*H03B 5/08* (2006.01)

(52) U.S. Cl.
USPC .. 331/36 C; 331/176; 331/177 R; 331/177 V; 331/117 R; 331/117 FE

(58) Field of Classification Search
USPC ............... 331/36 C, 177 V, 117 R, 117 FE, 331/167, 179; 329/352
See application file for complete search history.

(56) References Cited

U.S. PATENT DOCUMENTS

| 7,012,472 | B2 * | 3/2006 | Xu et al. | 331/16 |
| 2009/0261917 | A1 * | 10/2009 | Taghivand et al. | 331/36 C |
| 2011/0254632 | A1 * | 10/2011 | Sawada | 331/10 |
| 2012/0025921 | A1 * | 2/2012 | Yang et al. | 331/117 FE |
| 2012/0081188 | A1 * | 4/2012 | Liu et al. | 331/179 |

* cited by examiner

*Primary Examiner* — Ryan Johnson
*Assistant Examiner* — Christian L Rivera
(74) *Attorney, Agent, or Firm* — Garlick & Markison

(57) ABSTRACT

A technique to use an auxiliary varactor coupled to a tuning varactor, in which a temperature compensated bias signal adjusts a bias on the auxiliary varactor to maintain a voltage controlled oscillator (VCO) from drifting in frequency as operating temperature for the VCO changes.

20 Claims, 7 Drawing Sheets

VCO UTILIZING AN AUXILIARY VARACTOR WITH TEMPERATURE DEPENDENT BIAS

BACKGROUND OF THE INVENTION

1. Technical Field of the Invention

The embodiments of the invention relate to VCOs and, more particularly, to temperature compensation in the operation of VCOs.

2. Description of Related Art

Various wireless communication systems are known today to provide links between devices, whether directly or through a network. Such communication systems range from national and/or international cellular telephone systems, the Internet, point-to-point in-home system, as well as other systems. Communication systems typically operate in accordance with one or more communication standards or protocol. For instance, wireless communication systems may operate using protocols, such as IEEE 802.11, Bluetooth™, advanced mobile phone services (AMPS), digital AMPS, global system for mobile communications (GSM), code division multiple access (CDMA), local multi-point distribution systems (LMDS), multi-channel-multi-point distribution systems (MMDS), as well as others.

For each wireless communication device to participate in wireless communications, it generally includes a built-in radio transceiver (i.e., receiver and transmitter) or is coupled to an associated radio transceiver (e.g., a station for in-home and/or in-building wireless communication networks, modem, etc.). Typically, the transceiver includes a baseband processing stage and a radio frequency (RF) stage. The baseband processing provides the conversion from data to baseband signals for transmitting and baseband signals to data for receiving, in accordance with a particular wireless communication protocol. The baseband processing stage is coupled to a RF stage (transmitter section and receiver section) that provides the conversion between the baseband signals and RF signals. The RF stage may be a direct conversion transceiver that converts directly between baseband and RF or may include one or more intermediate frequency stage(s).

Furthermore, wireless devices typically operate within certain radio frequency ranges or band established by one or more communications standards or protocols. A local oscillator generally provides a local oscillation signal that is used to mix with received RF signals or baseband signals that are to be converted to RF signals in the modulation/demodulation stage of the RF front end. A synthesizer may be used to set the frequencies to drive the local oscillator to provide the desired frequencies for mixing, in which the desired frequencies are generally based on the channel frequencies established for the particular standard or protocol.

To generate various reference signals, clock signals, channel frequencies, etc., a wireless device typically uses a phase locked loop (PLL) circuit to produce a signal that locks to a particular frequency. Furthermore, in a typical (PLL), a control voltage is input to a voltage controlled oscillator (VCO), in which the control voltage establishes the frequency output from the VCO. Accordingly, for stable performance, the VCO should generate and maintain a locked frequency for a selected control voltage input.

However, the operational characteristics of the VCO and the PLL may vary if significant temperature variations are encountered by a device. That is, the VCO may experience frequency drift at its output, if temperature varies appreciably. For example, in continuous operation of a cellular 3G or 4G ($3^{rd}$ generation or $4^{th}$ generation) system, a VCO frequency drift over temperature may cause the PLL to unlock due to the VCO's inability to recalibrate over a temperature change. This condition may result, when the control voltage of the VCO exceeds the designated specification limits for the VCO, due to the temperature change. This problem becomes more pronounced at lower supply voltages, such as at supply voltages of approximately 1.2 volts, or less. In such a situation, a 3G wireless VCO may have 50 MHz drift over an operating temperature range of −20° C. to +85° C.

Accordingly, there is a need to obtain a much more stable VCO when operating at lower supply voltages over an appreciable temperature range in order to reduce or inhibit frequency drift of the PLL.

DETAILED DESCRIPTION OF THE INVENTION

The embodiments of the present invention may be practiced in a variety of devices that utilize a voltage controlled oscillator (VCO) and, in particular, a VCO used within a phase locked loop (PLL). However, the invention need not be limited to a PLL. Furthermore, the examples described herein describe the use of the VCO within a device having wireless communication capability, such as 3G and 4G mobile (or cellular) devices. However, the invention need not be limited to such wireless devices. The invention may be practiced with both wired and wireless devices.

Figure 1:
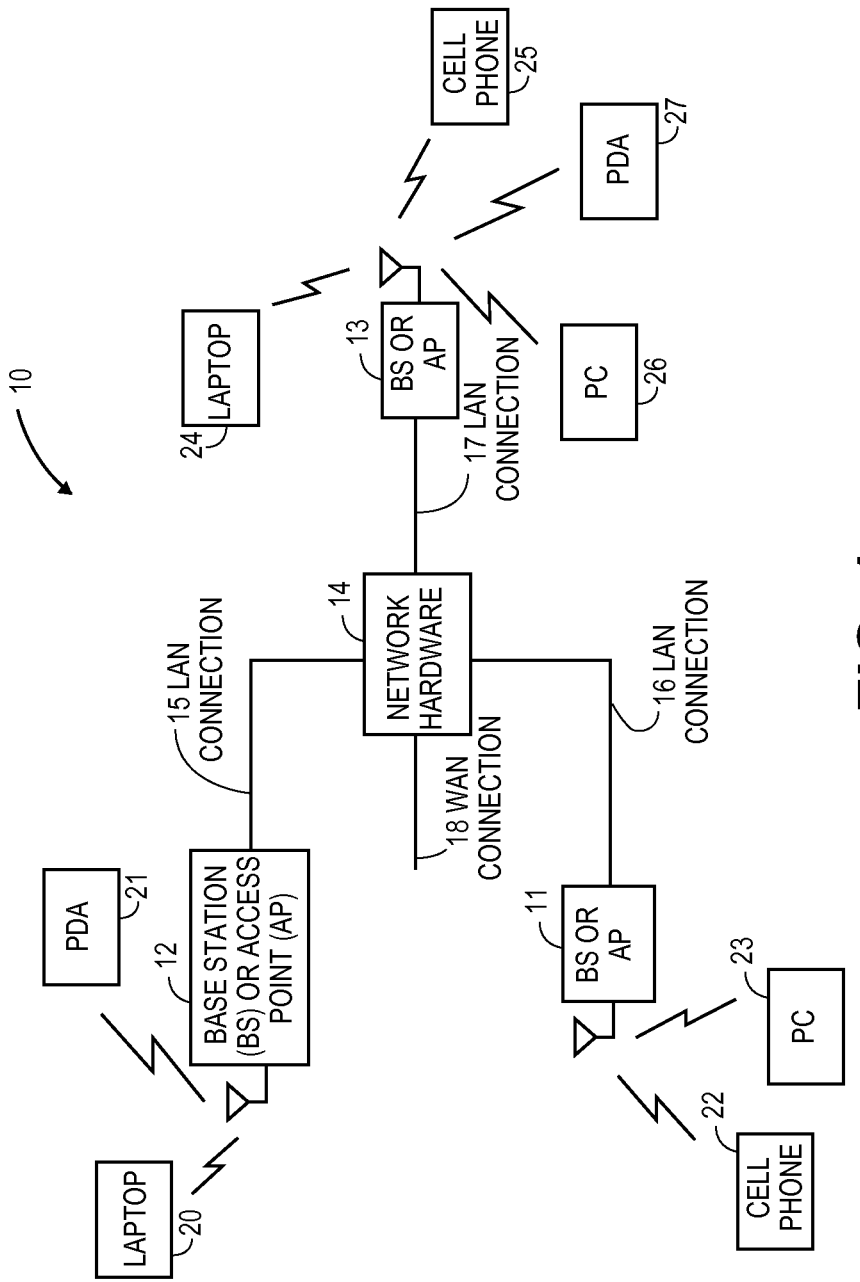
FIG. 1 is a block diagram showing a wireless communication system in accordance with one embodiment for practicing the present invention.

FIG. 1 illustrates one environment for practicing the present invention. FIG. 1 shows a communication system 10 that includes a plurality of base stations (BS) and/or access points (AP) 11-13, a plurality of wireless communication devices 20-27 and a network hardware component 14. The wireless communication devices 20-27 may be laptop computers 20 and 24, personal digital assistants 21 and 27, personal computers 23 and 26, cellular telephones 22 and 25, and/or any other type of device that supports wireless communications.

The base stations or access points 11-13 may be operably coupled to network hardware 14 via respective local area network (LAN) connections 15-17. Network hardware 14, which may be a router, switch, bridge, modem, system controller, etc., may provide a wide area network (WAN) connection 18 for communication system 10. Individual base station or access point 11-13 generally has an associated antenna or antenna array to communicate with the wireless communication devices in its area. Typically, the wireless communication devices register with a particular base station or access point 11-13 to receive services within communication system 10. For direct connections (i.e., point-to-point communications), wireless communication devices may communicate directly via an allocated channel.

Typically, base stations are used for cellular telephone systems (including 3G and 4G systems) and like-type systems, while access points are used for in-home or in-building wireless networks. Regardless of the particular type of communication system, each wireless communication device includes a built-in radio and/or is coupled to a radio. The radio includes a linear amplifier and/or programmable multi-stage amplifier to enhance performance, reduce costs, reduce size, and/or enhance broadband applications. The radio also includes, or is coupled to, an antenna or antennas having a particular antenna coverage pattern for propagating of outbound RF signals and/or reception of inbound RF signals.

Figure 2:
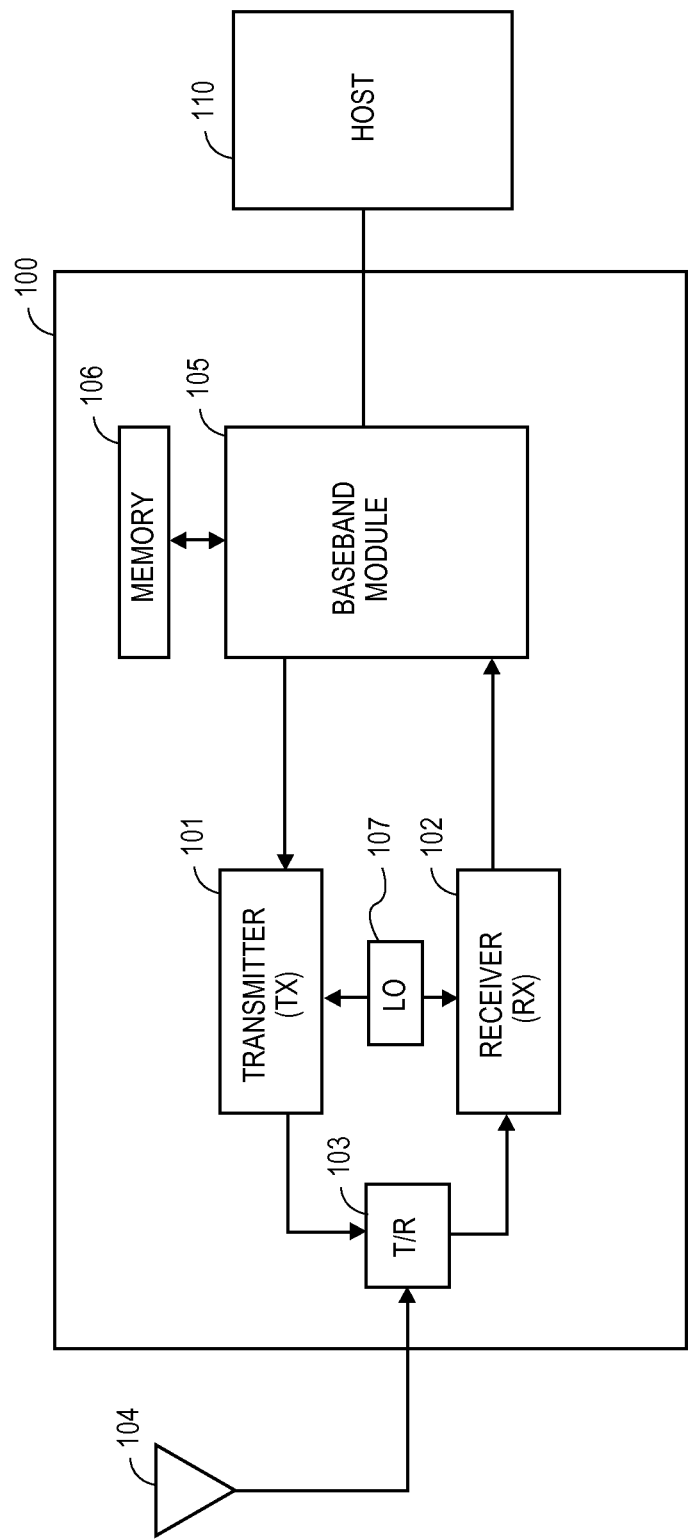
FIG. 2 is a schematic block diagram showing an embodiment of a wireless communication device for practicing the present invention.

FIG. 2 is a schematic block diagram illustrating part of a wireless communication device 100 that includes a transmitter (TX) 101, receiver (RX) 102, local oscillator (LO) 107 and baseband module 105. Baseband module 105 provides baseband processing operations. In some embodiments, baseband module 105 is or includes a digital-signal-processor (DSP). Baseband module 105 is typically coupled to a host unit, applications processor or other unit(s) that provides operational processing for the device and/or interface with a user.

In FIG. 2, a host unit 110 is shown. For example, in a notebook or laptop computer, host 110 may represent the computing portion of the computer, while device 100 is utilized to provide WiFi and/or Bluetooth components for communicating wirelessly between the computer and an access point and/or between the computer and a Bluetooth device. Similarly, for a handheld audio or video device, host 110 may represent the application portion of the handheld device, while device 100 is utilized to provide WiFi and/or Bluetooth components for communicating wirelessly between the handheld device and an access point and/or between the handheld device and a Bluetooth device. Alternatively, for a mobile telephone, such as a cellular phone, device 100 may represents the radio frequency (RF) and baseband portions of the phone and host 110 may provide the user application/interface portion of the phone. Furthermore, device 100 may be incorporated in one or more of the wireless communication devices 20-27 shown in FIG. 1.

A memory 106 is shown coupled to baseband module 105, which memory 106 may be utilized to store data, as well as program instructions that operate on baseband module 105. Various types of memory devices may be utilized for memory 106. It is to be noted that memory 106 may located anywhere within device 100 and, in one instance, it may also be part of baseband module 105.

Transmitter 101 and receiver 102 are coupled to an antenna 104 via transmit/receive (T/R) switch module 103. T/R switch module 103 switches the antenna between the transmitter and receiver depending on the mode of operation. It is to be noted that in other embodiments, antenna arrays may be used, such as beam-forming antenna arrays. Still in other embodiments, separate antennas may be used for transmitter 101 and receiver 102, respectively. Furthermore, in other embodiments, multiple antennas or antenna arrays may be utilized with device 100 to provide antenna diversity or multiple input and/or multiple output, such as MIMO, capabilities.

Outbound data for transmission from host unit 110 are coupled to baseband module 105 and converted to baseband signals and then coupled to transmitter 101. Transmitter 101 converts the baseband signals to outbound radio frequency (RF) signals for transmission from device 100 via antenna 104. Transmitter 101 may utilize one of a variety of up-conversion or modulation techniques to convert the outbound baseband signals to outbound RF signal. Generally, the conversion process is dependent on the particular communication standard or protocol being utilized.

In a similar manner, inbound RF signals are received by antenna 104 and coupled to receiver 102. Receiver 102 then converts the inbound RF signals to inbound baseband signals, which are then coupled to baseband module 105. Receiver 102 may utilize one of a variety of down-conversion or demodulation techniques to convert the inbound RF signals to inbound baseband signals. The inbound baseband signals are processed by baseband module 105 and inbound data is output from baseband module 105 to host unit 110.

LO 107 provides local oscillation signals for use by transmitter 101 for up-conversion and by receiver 102 for down-conversion. In some embodiments, separate LOs may be used for transmitter 101 and receiver 102. Although a variety of LO circuitry may be used, in some embodiments, a PLL is utilized to lock the LO to output a frequency stable LO signal based on a selected channel frequency.

It is to be noted that in one embodiment, baseband module 105, LO 107, transmitter 101 and receiver 102 are integrated on the same integrated circuit (IC) chip. Transmitter 101 and receiver 102 are typically referred to as the RF front-end. In other embodiments, one or more of these components may be on separate IC chips. Similarly, other components shown in FIG. 2 may be incorporated on the same IC chip, along with baseband module 105, LO 107, transmitter 101 and receiver 102. In some embodiments, the antenna 104 may also be incorporated on the same IC chip as well. Furthermore, with the advent of system-on-chip (SOC) integration, host devices, application processors and/or user interfaces, such as host unit 110, may be integrated on the same IC chip along with baseband module 105, transmitter 101 and receiver 102.

Additionally, although one transmitter 101 and receiver 102 are shown, it is to be noted that other embodiments may utilize multiple transmitter units and receiver units, as well as multiple LOs. For example, diversity communication and/or multiple input and/or multiple output communications, such as multiple-input-multiple-output (MIMO) communication, may utilize multiple transmitters 101 and/or receivers 102 as part of the RF front-end. As will be described below, a VCO incorporating one embodiment of the invention is utilized within one or more components of FIG. 2. In one embodiment, the VCO is a component of a PLL used in LO 107.

Figure 3:
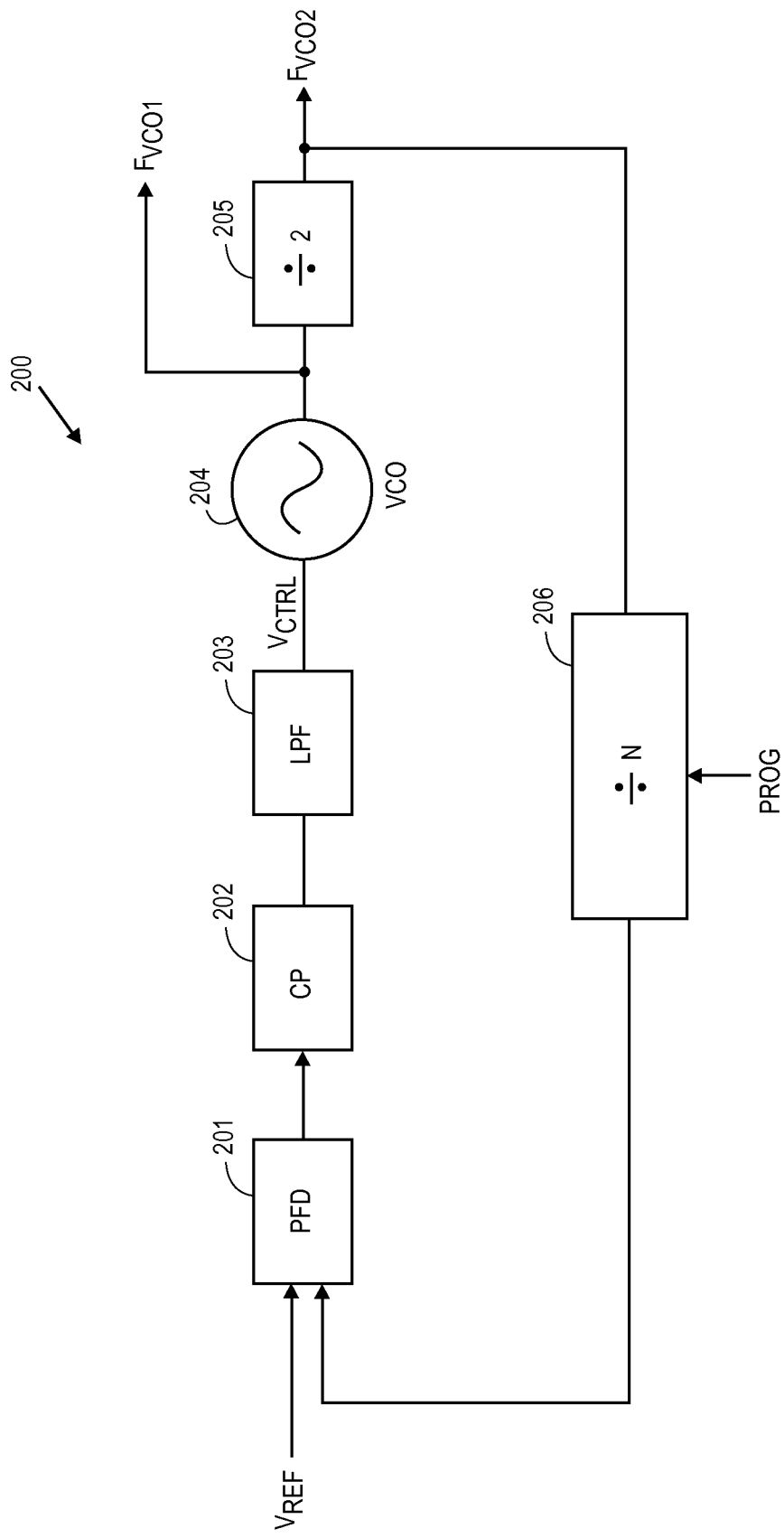
FIG. 3 is a block diagram of a PLL, in which the present invention is implemented in a VCO circuit of the PLL.

FIG. 3 shows a PLL-based frequency synthesizer 200 that may be implemented as one embodiment for practicing the invention. Synthesizer (or PLL) 200 is a closed loop system utilizing a phase-frequency detector (PFD) 201, charge pump (CP) 202, low-pass filter (LPF) 203, VCO 204 and a divide by N (÷N) circuit 206 in the feedback loop. In this particular embodiment, a divide by 2 (÷2) circuit 205 is also used at the output of VCO 204. Other embodiments may utilize a different divider circuit or not use divide by 2 circuit 205.

Divider circuit 206 in the feedback loop may be an integer divider, fractional divider or a combination of both. Divider 206 may be programmable (as shown by program signal PROG in FIG. 3) to programmably select the divisor factor N for synthesizer 200. A control voltage $V_{CTRL}$ at the input of VCO 204 determines the frequency of the signal output from VCO 204. The synthesizer output signal, $F_{VCO}$, may be obtained at the output of VCO 204 (shown as output $F_{VCO1}$) or at the output of divide by 2 circuit 205 (shown as $F_{VCO2}$).

In operation, synthesizer 200 operates as a PLL, in which PFD 201 receives the feedback signal of the synthesizer output from divider circuit 206 and compares the feedback signal to a reference signal $V_{REF}$. PFD 201 detects any frequency/phase difference and generates an error signal to CP 202 to produce a control voltage. After filtering by LPF 203, the control voltage $V_{CTRL}$ is sent to VCO 204, wherein $V_{CTRL}$ determines the frequency of the signal output from VCO 204. When operating properly, $V_{CTRL}$ is continually adjusted to maintain $F_{VCO}$ output from VCO 204 locked to a particular frequency selected by $V_{REF}$. As noted above, synthesizer 200 may be incorporated within one of the components noted in FIG. 2 and in one embodiment, synthesizer 200 is used for a PLL-based oscillation signal generator for LO 107. For mobile phone applications, a particular $V_{REF}$, and hence a particular $V_{CTRL}$ is selected for a given channel frequency to be used for wireless communication.

A VCO is expected to maintain a substantially constant frequency output for a given $V_{CTRL}$ input. Typically, this is not a problem when the surrounding environment is static. However, in situations where the operating temperature changes, a VCO may have difficulty maintaining a desired frequency output. Where the VCO is intended to operate over a wide temperature range, an appreciable change in temperature may cause the VCO to drift in frequency. If the frequency drift is significant, the PLL may unlock. Also, this frequency drift is more noticeable at lower supply voltages.

Figure 4:
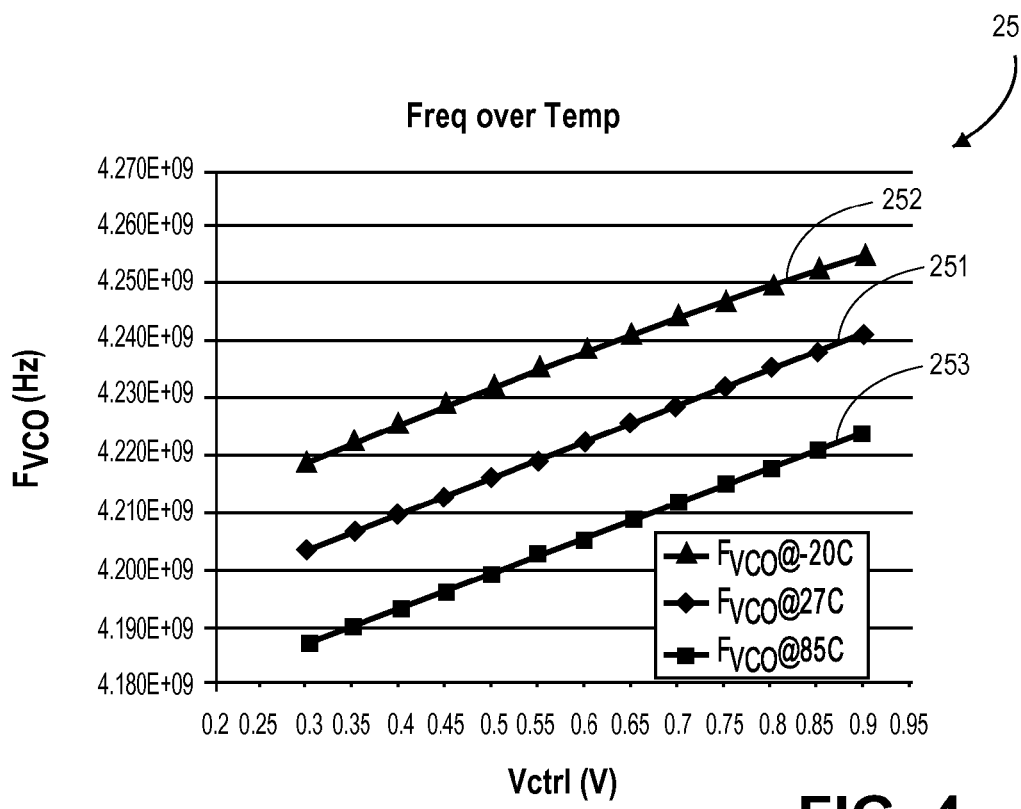
FIG. 4 is a graph illustrating one example of a VCO frequency drift over temperature.

FIG. 4 illustrates a case in point. Graph 250 illustrates three curves 251-253, in which $V_{CTRL}$ voltage input to the VCO is plotted against the frequency of the VCO output, $F_{VCO}$. The center curve 251 represents $V_{CTRL}$ versus $F_{VCO}$ at near room temperature (+27° C.), while curve 253 represents the response at approximately +85° C. and curve 252 represents the response at approximately −20° C. Graph 250 assumes an operating range of $V_{CTRL}$ approximately between 0.3V and 0.9V. Note that the lower $F_{VCO}$ frequency value of the nominal curve 251 (at about 4.200 GHz) may not be obtainable when the temperature drops appreciably. At −20 C.°, curve 252 shows the lowest $F_{VCO}$ output at about 4.220 GHz Likewise, the higher $F_{VCO}$ value of the nominal curve 251 (at about 4.24 GHz) is not obtainable when the temperature rises appreciably. At 85 C.°, curve 253 shows the highest $F_{VCO}$ output at about 4.225 GHz. Assuming that the nominal curve 251 represents the approximate operating range for the VCO output, at the extremities the frequency drift over temperature may be substantial to place the VCO (and hence the PLL) to unlock.

Figure 5:
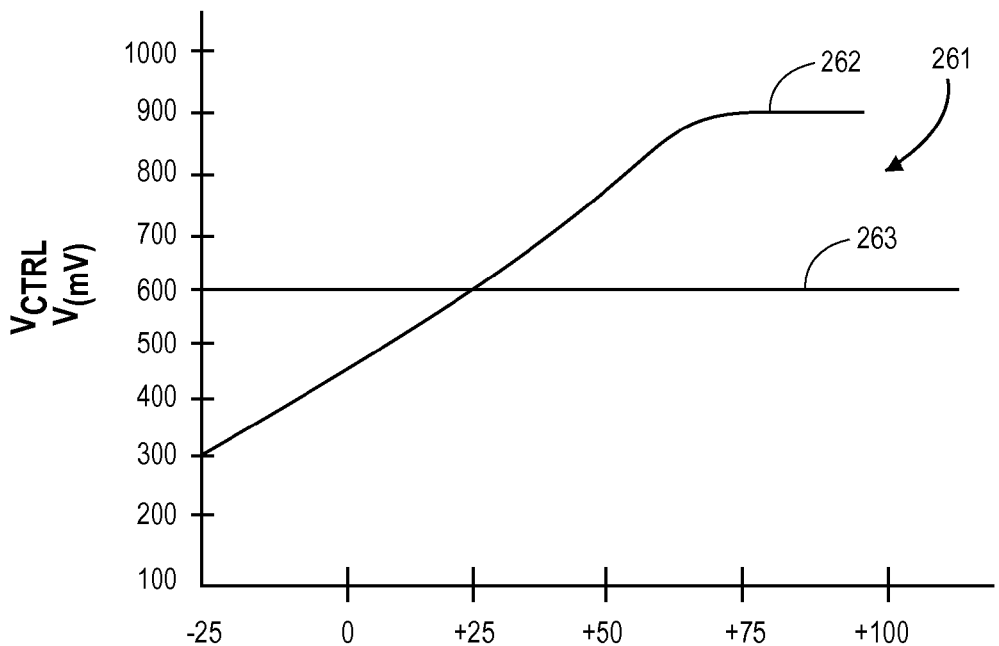
FIG. 5 is a graph illustrating one example of varying the control voltage of the VCO in order to maintain a substantially constant frequency response over temperature.

FIG. 5 shows a graph 260 that illustrates the effects of temperature versus $V_{CTRL}$ at a particular $F_{VCO}$. Assuming from FIG. 4 that the mid-point of the operating range of $V_{CTRL}$ is 600 mV, then curve 263 shows the response needed by $V_{CTRL}$ to maintain the same frequency (approximately 4.22 GHz) over the temperature range. As temperature increases, higher $V_{CTRL}$ is needed to maintain the same $F_{VCO}$ and as temperature decreases, lower $V_{CTRL}$ is needed to maintain the same $F_{VCO}$. An ideal response curve 263 is shown in FIG. 4, in which it would be ideal to obtain the same FVCO at 600 mV, no matter what the temperature. That is, it would be ideal to obtain the characteristics of the nominal curve 251 of FIG. 4 over the full operating temperature range. As will be described below, one technique is to provide a temperature compensating auxiliary varactor in a VCO circuit in order to reduce the dependence on temperature in operating the VCO.

Figure 6:
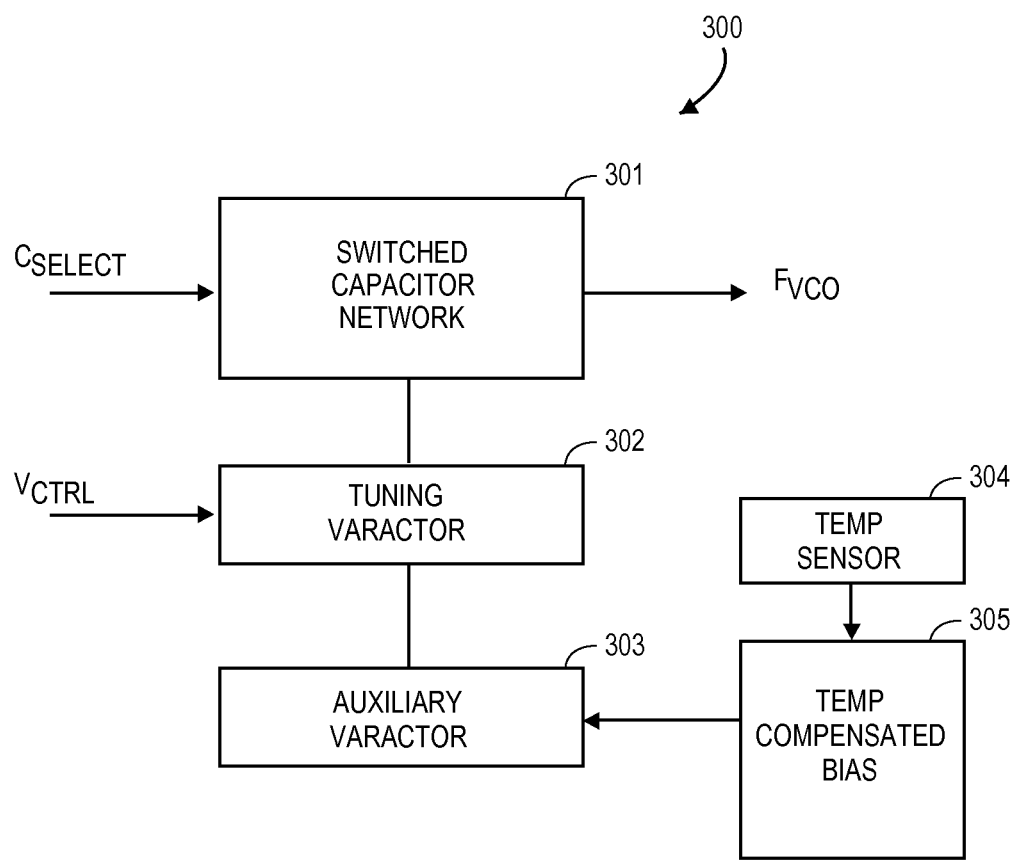
FIG. 6 is a circuit block diagram depicting one embodiment for practicing the invention, in which a temperature compensated auxiliary varactor is utilized to inhibit frequency drift in the VCO over variations in temperature.

FIG. 6 illustrates a VCO 300 comprised of a switched capacitor network or bank 301, a tuning varactor 302 and an auxiliary varactor 303. In one embodiment, VCO 300 is utilized as VCO 204 of FIG. 3. In one embodiment, switched capacitor network 301 is comprised of a plurality of capacitors that are switched in and out by a control signal, noted as $C_{SELECT}$ in FIG. 6. In one embodiment a particular set of capacitor or capacitors of capacitor network 301 is/are selected for coarse frequency setting, such as when a particular communication channel is to be selected. $F_{VCO}$ is shown as an output from capacitor network 301. It is to be noted that other reactive components may be utilized in place of a plurality of switched capacitors of capacitor network 301 to provide the frequency selection.

A tuning varactor 302 is coupled to capacitor network 301 and provides the fine tuning adjustment to generate $F_{VCO}$. $V_{CTRL}$ input is coupled to tuning varactor 302, in which tuning varactor 302 is adjusted by the value of $V_{CTRL}$. Thus, output $F_{VCO}$ is determined by the selection of capacitors of capacitor network 301 and the tuning adjustment provided by tuning varactor 302 in response to the $V_{CTRL}$ input.

Auxiliary varactor 303 is coupled to tuning varactor 302, as well as to a temperature compensated bias circuit 305. Temperature compensated bias circuit 305 provides a temperature adjusted bias to auxiliary varactor 303. A temperature sensor 304, coupled to temperature compensated bias circuit 305, monitors the temperature of the surrounding environment and generates a signal indicative of the sensed temperature. Temperature compensated bias circuit 305 receives the temperature indication and, in response, generates a bias signal to auxiliary varactor 303. The bias signal is used to bias auxiliary varactor 303.

The temperature compensated bias provided by circuit 305 is a bias signal for biasing auxiliary varactor 303. Depending on the temperature, the biasing of auxiliary varactor is adjusted to maintain a substantially uniform $F_{VCO}$ for a given $V_{CTRL}$, such as noted with curve 263 in FIG. 5. In reference to FIG. 4, the temperature adjusted biasing provides a fairly uniform nominal response, such as that of curve 251 in FIG. 4, independent of temperature. That is, the shifting of curve 251 due to frequency drift is inhibited, or at least reduced, by providing a temperature adjusted biasing signal to auxiliary varactor 303. The temperature adjusted bias provides biasing to tune varactor 303, so that varactor 303 compensates for the frequency drift exhibited by tuning varactor 302.

Figure 7:
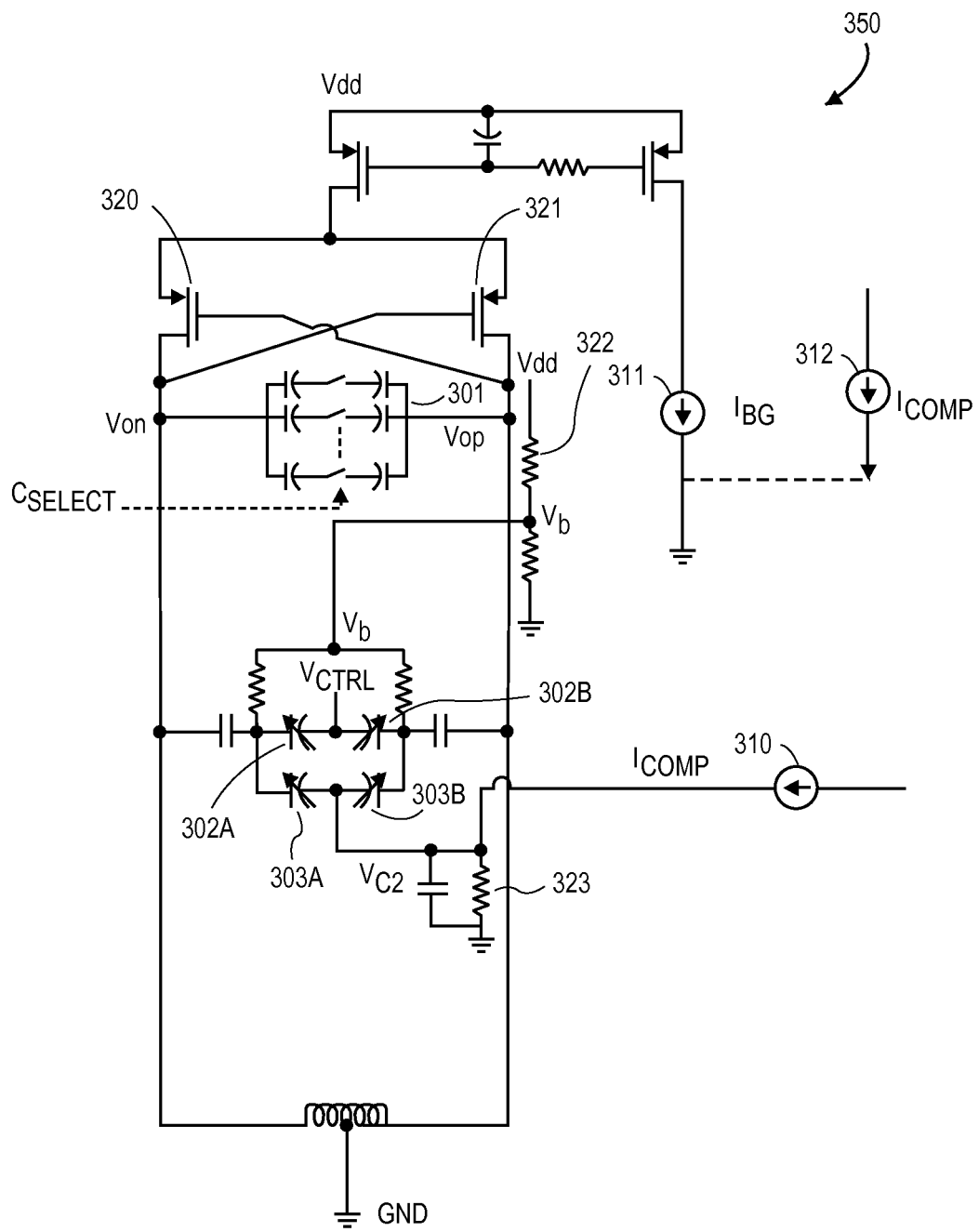
FIG. 7 is a circuit schematic diagram that illustrates one embodiment for implementing the auxiliary varactor circuit of FIG. 6 in a VCO.

FIG. 7 shows one embodiment of a circuit 350 to implement VCO 300 of FIG. 6. Circuit 350 provides for a differential output (Von and Vop) that corresponds to the $F_{VCO}$ output from the VCO. As shown in circuit 350, the plurality of capacitors that comprise switched capacitor network 301 are coupled across the drains of cross-coupled differential transistors 320, 321. Tuning varactor 302 and auxiliary varactor 303 are also coupled across the drains of the cross-coupled transistors 320, 321, in which a pair of auxiliary varactors reside in parallel to a pair of tuning varactors. Because of the differential setup, both tuning varactor 302 and auxiliary varactor 303 are comprised as pair of varactors, shown as tuning varactor pairs 302A, 302B and auxiliary varactor pairs 303A, 303B. A voltage divider network 322 provides the base biasing to the varactors. The base biasing voltage is shown as Vb.

The $V_{CTRL}$ voltage to the VCO is coupled as input to varactors 302A, 302B at the junction of the two varactors to provide the fine tuning control for the VCO. The temperature compensated bias signal $V_{C2}$ is provided to the junction of the two varactors 303A, 303B. That is, instead of providing $V_{CTRL}$, the temperature compensated bias signal $V_{C2}$ is provided to varactors 303A, 303B. As noted above, the temperature compensated bias signal biases auxiliary varactors 303A, 303B to compensate for frequency drift that may occur in tuning varactors 302A, 302B over a range of operating temperatures. The biasing of varactors 303A, 303B is adjusted as temperature variations are sensed and this bias adjustment compensates for frequency drift encountered by tuning varactors 302A, 302B, as well as capacitor network 301. The bias adjustment is calculated to maintain a substantially constant $F_{VCO}$ in response to a selected $V_{CTRL}$ over the operating temperature range of the VCO.

It is to be noted that a variety of compensating techniques may be implemented to provide the temperature compensated biasing of auxiliary varactors 303A, 303B. The embodiment shown for circuit 350 utilizes a compensating current, shown as $I_{COMP}$ generated by current source 310. $I_{COMP}$ is coupled to resistor 323 to develop the temperature compensated biasing voltage $V_{C2}$.

$I_{COMP}$ is generated by temperature compensated bias circuit 305, in which the value of the current is determined by the temperature about the VCO, which temperature may be ambient temperature. As the operating temperature varies, $I_{COMP}$ changes correspondingly to provide a compensating bias on varactors 303A, 303B, so that the VCO frequency drift is inhibited or at least reduced so that the PLL does not drift out of lock.

In 350 a bandgap current, $I_{BG}$, provides the current which is mirrored by the tuning stages to the left of the diagram. As noted, the bandgap current may also be temperature compensated by $I_{COMP}$ as well, so that the driven current for the VCO is also temperature compensated. Current source 312 is shown generating the compensating current that adds or subtracts from $I_{BG}$ based on the operating temperature. The $I_{COMP}$ of current source 312 may be of same value or different value as the $I_{COMP}$ from current source 310. Furthermore, although P-type transistors are shown in circuit 350, equivalent circuit 350 may be implemented using N-type devices.

Figure 8:
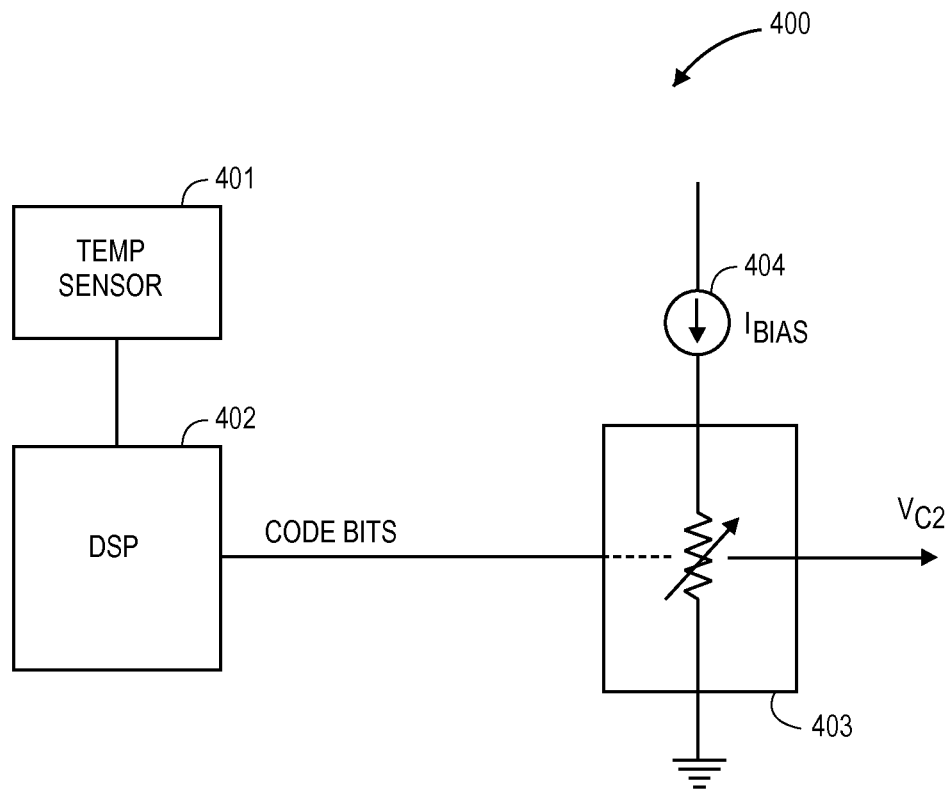
FIG. 8 is a block diagram showing one example for generating a temperature dependent bias for the auxiliary varactor of FIGS. 6 and 7.

It is to be appreciated that the compensating current value and hence the biasing voltage may be determined by various means for the particular integrated circuit that contains the VCO. Furthermore, the adjustment changes may be provided as a continuous adjustment (e.g. continuously changing $I_{COMP}$) or it may be done in discrete steps. Accordingly, FIG. 8 shows one embodiment of a circuit 400 in which a temperature sensor 401 is coupled to a digital signal processor (DSP) 402, wherein DSP 402 categorizes the temperature into temperature regions. Code bits are then sent to a voltage divider network (such as a resistor ladder) 403 based on the particular region the operating temperature falls into and the bias voltage $V_{C2}$ is generated based on that region. A constant bias current source 404 may be used to bias the divider (or ladder) network. It is to be noted that other techniques may be used as well in other embodiments to provide either continuous or discrete adjustments of $V_{C2}$.

Accordingly, a VCO that utilizes a temperature dependent bias to compensate for frequency drift over temperature is described.

As may be used herein, the terms "substantially" and "approximately" provides an industry-accepted tolerance for its corresponding term and/or relativity between items. Such an industry-accepted tolerance ranges from less than one percent to fifty percent. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more corresponding functions and may further include inferred coupling to one or more other items.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:

1. An apparatus comprising:
a first varactor of a voltage controlled oscillator (VCO) to receive a control voltage to tune the VCO and generate a VCO output having a frequency $F_{VCO}$ determined by the control voltage;
a processor coupled to receive an indication of temperature, categorize the temperature into one of a plurality of temperature regions and generate a signal indicative of the one temperature region corresponding to the temperature;
a bias circuit coupled to receive the signal indicative of the one temperature region corresponding to the temperature and to generate a temperature compensated bias signal based on the signal indicative of the one temperature region; and
a second varactor coupled to the first varactor and to the bias circuit to respond to the temperature compensated bias signal, in which the temperature compensated bias signal adjusts a bias on the second varactor to compensate for frequency drift of the $F_{VCO}$ in discrete steps corresponding to the plurality of temperature regions over a range of operating temperatures for the VCO.

2. The apparatus of claim 1, wherein the processor is a digital signal processor.

3. The apparatus of claim 2, wherein the circuit includes a resistor ladder to operate as a voltage divider network to generate the temperature compensated bias signal.

4. The apparatus of claim 3, wherein the digital signal processor generates code bits as the signal indicative of the one temperature range to select resistors of the resistor ladder network.

5. The apparatus of claim 1, wherein the bias circuit generates the temperature compensated bias signal from a temperature compensated current source.

6. The apparatus of claim 5, wherein the bias circuit includes a resistor ladder to operate as a voltage divider network to generate the temperature compensated bias signal from the temperature compensated current source.

7. An apparatus comprising:
a primary tuning circuit of a voltage controlled oscillator (VCO) of a phase locked loop (PLL) to provide coarse tuning of the VCO and to generate a VCO output having a frequency $F_{VCO}$;

a tuning varactor coupled to the primary tuning circuit and coupled to receive a control voltage to fine tune the VCO to generate the VCO output, in which $F_{VCO}$ is determined by the control voltage;

a processor coupled to receive an indication of temperature, categorize the temperature into one of a plurality of temperature regions and generate a signal indicative of the one temperature region corresponding to the temperature;

a bias circuit coupled to receive the signal indicative of the one temperature region corresponding to the temperature and to generate a temperature compensated bias signal based on the signal indicative of the one temperature region; and an auxiliary varactor coupled to the tuning varactor and to the bias circuit to respond to the temperature compensated bias signal, in which the temperature compensated bias signal adjusts a bias on the auxiliary varactor to compensate for frequency drift of the VCO which causes the PLL from maintaining a lock on $F_{VCO}$ in discrete steps corresponding to the plurality of temperature regions over a range of operating temperatures for the VCO.

8. The apparatus of claim 7, wherein the primary tuning circuit is a switched capacitor network and in which a select signal coupled to the switched capacitor network programmably selects one or more capacitors for coarse tuning the VCO.

9. The apparatus of claim 8, wherein the processor is a digital signal processor.

10. The apparatus of claim 9, wherein the bias circuit includes a resistor ladder to operate as a voltage divider network to generate the temperature compensated bias signal.

11. The apparatus of claim 10, wherein the digital signal processor generates code bits as the signal indicative of the one temperature range to select resistors of the resistor ladder network.

12. The apparatus of claim 8, wherein the bias circuit generates the temperature compensated bias signal from a temperature compensated current source.

13. The apparatus of claim 12, wherein the bias circuit includes a resistor ladder to operate as a voltage divider network to generate the temperature compensated bias signal from the temperature compensated current source.

14. A method comprising:
tuning a primary tuning circuit of a voltage controlled oscillator (VCO) of a phase locked loop (PLL) to provide coarse tuning of the VCO and to generate a VCO output having a frequency $F_{VCO}$;

tuning a tuning varactor coupled to the primary tuning circuit and coupled to receive a control voltage to fine tune the VCO to generate the VCO output, in which $F_{VCO}$ is determined by the control voltage;

receiving an indication of temperature at a processor and categorizing the temperature into one of a plurality of temperature regions;

generating, from the processor, a signal indicative of the one temperature region corresponding to the temperature;

receiving the signal indicative of the one temperature region corresponding to the temperature at a bias circuit and generating a temperature compensated bias signal based on the signal indicative of the one temperature region; and biasing an auxiliary varactor coupled to the tuning varactor and to the bias circuit to respond to the temperature compensated bias signal, in which the temperature compensated bias signal adjusts a bias on the auxiliary varactor to compensate for frequency drift of the VCO which causes the PLL from maintaining a lock on $F_{VCO}$ in discrete steps corresponding to the plurality of temperature regions over a range of operating temperatures for the VCO.

15. The method of claim 14, wherein tuning the primary tuning circuit includes tuning a switched capacitor network and in which a select signal coupled to the switched capacitor network programmably selects one or more capacitors for coarse tuning the VCO.

16. The method of claim 15, wherein when generating the signal indicative of the one temperature region from the processor, the processor is a digital signal processor.

17. The method of claim 16, wherein when generating the temperature compensated bias signal at the bias circuit, the bias circuit utilizes a resistor ladder to operate as a voltage divider network in generating the temperature compensated bias signal.

18. The method of claim 17, wherein when generating the signal indicative of the one temperature region from the processor, generating code bits as the signal indicative of the one temperature region.

19. The method of claim 14, further including generating the temperature compensated bias signal from a temperature compensated current source.

20. The method of claim 19, wherein when generating the temperature compensated bias signal, the bias circuit utilizes a voltage divider network in generating the temperature compensated bias signal from the temperature compensated current source.

* * * * *

UNITED STATES PATENT AND TRADEMARK OFFICE
CERTIFICATE OF CORRECTION

PATENT NO. : 8,466,750 B2  Page 1 of 1
APPLICATION NO. : 13/170040
DATED : June 18, 2013
INVENTOR(S) : Janice Chiu et al.

It is certified that error appears in the above-identified patent and that said Letters Patent is hereby corrected as shown below:

In the Claims

Col. 8, line 49, in claim 3: after "claim 2, wherein the" insert --bias--

Signed and Sealed this
Eighteenth Day of February, 2014

Michelle K. Lee
*Deputy Director of the United States Patent and Trademark Office*